United States Patent
Peng et al.

(10) Patent No.: US 9,954,069 B2
(45) Date of Patent: Apr. 24, 2018

(54) SEMICONDUCTOR DEVICE AND METHOD OF FORMING VERTICAL STRUCTURE

(71) Applicant: Taiwan Semiconductor Manufacturing Company Limited, Hsinchu (TW)

(72) Inventors: Chih-Tang Peng, Hsinchu County (TW); Tai-Chun Huang, Hsinchu (TW); Teng-Chun Tsai, Hsinchu (TW); Cheng-Tung Lin, Hsinchu County (TW); De-Fang Chen, Hsinchu (TW); Li-Ting Wang, Hsinchu (TW); Chien-Hsun Wang, Hsinchu (TW); Huan-Just Lin, Hsinchu (TW); Yung-Cheng Lu, Hsinchu (TW); Tze-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 60 days.

(21) Appl. No.: 15/084,607

(22) Filed: Mar. 30, 2016

(65) Prior Publication Data
US 2016/0211370 A1    Jul. 21, 2016

Related U.S. Application Data

(62) Division of application No. 14/334,724, filed on Jul. 18, 2014, now Pat. No. 9,318,447.

(51) Int. Cl.
*H01L 29/423* (2006.01)
*H01L 29/66* (2006.01)
(Continued)

(52) U.S. Cl.
CPC ........ *H01L 29/42392* (2013.01); *B82Y 10/00* (2013.01); *B82Y 40/00* (2013.01);
(Continued)

(58) Field of Classification Search
CPC .......... H01L 29/7827; H01L 29/66272; H01L 29/66666; H01L 29/78642; H01L 29/7889;
(Continued)

(56) References Cited

U.S. PATENT DOCUMENTS 5,294,814 A * 3/1994 Das ............... H01L 29/1602
257/263
6,238,976 B1 * 5/2001 Noble ............ H01L 21/28273
257/E21.693
(Continued)

FOREIGN PATENT DOCUMENTS

CN    102290441 A    12/2011
CN    102832221 A    12/2012
(Continued)

OTHER PUBLICATIONS

Korean Office Action; Application No. 10-2014-0181818; dated Dec. 7, 2015.
(Continued)

*Primary Examiner* — Joseph C Nicely
(74) *Attorney, Agent, or Firm* — McDermott Will & Emery LLP

(57) ABSTRACT

A semiconductor device includes a source/drain region, a barrier layer, and an interlayer dielectric. The barrier layer surrounds the source/drain region. The interlayer dielectric surrounds the barrier layer. As such, the source/drain region can be protected by the barrier layer from oxidation during manufacturing of the semiconductor device, e.g., the formation of the interlayer dielectric.

20 Claims, 29 Drawing Sheets

(51) Int. Cl.
  *H01L 29/788* (2006.01)
  *H01L 21/02* (2006.01)
  *H01L 23/00* (2006.01)
  *H01L 29/78* (2006.01)
  *B82Y 10/00* (2011.01)
  *B82Y 40/00* (2011.01)
  *H01L 29/775* (2006.01)
  *H01L 29/06* (2006.01)
  *H01L 23/29* (2006.01)
  *H01L 23/31* (2006.01)
  *H01L 27/088* (2006.01)

(52) U.S. Cl.
  CPC .... *H01L 21/0217* (2013.01); *H01L 21/02126* (2013.01); *H01L 21/02167* (2013.01); *H01L 23/291* (2013.01); *H01L 23/3171* (2013.01); *H01L 23/564* (2013.01); *H01L 27/088* (2013.01); *H01L 29/0676* (2013.01); *H01L 29/42356* (2013.01); *H01L 29/66272* (2013.01); *H01L 29/66439* (2013.01); *H01L 29/66666* (2013.01); *H01L 29/775* (2013.01); *H01L 29/7827* (2013.01); *H01L 29/7889* (2013.01); *H01L 2924/0002* (2013.01)

(58) Field of Classification Search
  CPC .............. H01L 29/0676; H01L 29/7788; H01L 29/7395; H01L 29/7371; H01L 29/732; H01L 29/42392; H01L 29/42356; H01L 23/3171; H01L 23/564; H01L 27/088
  See application file for complete search history.

(56) References Cited

U.S. PATENT DOCUMENTS

| | | | | |
|---|---|---|---|---|
| 6,642,575 | B1* | 11/2003 | Ono | H01L 21/823828 257/302 |
| 8,802,551 | B1* | 8/2014 | Seo | H01L 21/76816 257/E21.249 |
| 2008/0217711 | A1 | 9/2008 | Sugiyama et al. | |
| 2009/0008631 | A1* | 1/2009 | Hurkx | B82Y 10/00 257/25 |
| 2009/0078993 | A1* | 3/2009 | Fujimoto | H01L 29/7827 257/328 |
| 2009/0170302 | A1* | 7/2009 | Shin | H01L 29/4236 438/589 |
| 2009/0200604 | A1* | 8/2009 | Chidambarrao | H01L 29/66787 257/329 |
| 2010/0219482 | A1* | 9/2010 | Masuoka | H01L 27/0207 257/369 |
| 2010/0330759 | A1* | 12/2010 | Forbes | B82Y 10/00 438/269 |
| 2011/0303973 | A1* | 12/2011 | Masuoka | H01L 21/26586 257/329 |
| 2013/0093000 | A1* | 4/2013 | Guo | H01L 29/4983 257/329 |
| 2013/0095623 | A1* | 4/2013 | Guo | H01L 29/4983 438/268 |
| 2013/0307057 | A1* | 11/2013 | Masuoka | H01L 29/66666 257/329 |
| 2014/0061775 | A1* | 3/2014 | Chuang | H01L 21/823814 257/329 |
| 2014/0091385 | A1* | 4/2014 | Masuoka | H01L 21/823885 257/329 |
| 2014/0097494 | A1* | 4/2014 | Masuoka | H01L 29/66795 257/365 |
| 2014/0166981 | A1* | 6/2014 | Doyle | H01L 29/66666 257/24 |
| 2014/0170821 | A1* | 6/2014 | Nyhus | H01L 29/66666 438/268 |
| 2015/0228718 | A1* | 8/2015 | Lin | H01L 29/0653 257/329 |
| 2015/0303202 | A1 | 10/2015 | Sun et al. | |
| 2015/0333152 | A1* | 11/2015 | Lin | H01L 29/1037 257/329 |
| 2015/0348977 | A1* | 12/2015 | Barth, Jr. | H01L 27/1203 257/302 |
| 2015/0357428 | A1 | 12/2015 | Masuoka et al. | |
| 2015/0364333 | A1* | 12/2015 | Chen | H01L 21/3085 257/329 |
| 2015/0364358 | A1* | 12/2015 | Tsai | H01L 21/762 438/400 |
| 2015/0372082 | A1* | 12/2015 | Wu | H01L 21/8234 257/9 |
| 2015/0372083 | A1* | 12/2015 | Tang | H01L 29/0684 257/9 |
| 2015/0380548 | A1* | 12/2015 | Wang | H01L 29/7827 257/329 |
| 2016/0020180 | A1* | 1/2016 | Peng | H01L 23/291 257/329 |
| 2016/0064541 | A1* | 3/2016 | Diaz | H01L 29/66666 257/329 |
| 2017/0148899 | A1* | 5/2017 | Ohtou | H01L 29/66666 |
| 2017/0309707 | A1* | 10/2017 | Tang | H01L 21/823418 |

FOREIGN PATENT DOCUMENTS

| | | |
|---|---|---|
| JP | 2005012214 | 1/2005 |
| KR | 20120139067 | 12/2012 |

OTHER PUBLICATIONS

Office Action issued in corresponding Chinese Patent Application No. 201410804259.1, dated Aug. 28, 2017.

* cited by examiner

SEMICONDUCTOR DEVICE AND METHOD OF FORMING VERTICAL STRUCTURE

CROSS-REFERENCE TO RELATED APPLICATION

This application is a divisional of U.S. patent application Ser. No. 14/334,724, filed Jul. 18, 2014, which is incorporated herein by reference in its entirety.

BACKGROUND

Vertical semiconductor devices, such as vertical gate-all-around transistors, are an emerging research area in the semiconductor industry. However, the process integration for the device is always a challenge because essentials of the device are vulnerable to oxidation. Therefore, there is a need to improve the above deficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
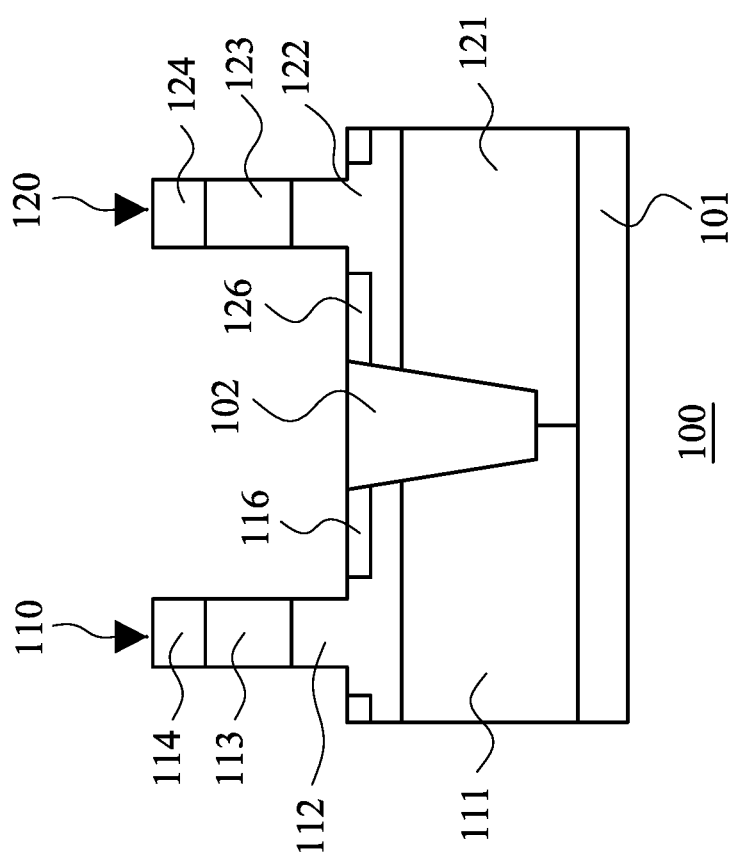
FIGS. 1-14, 4a, 4b, 11a are sectional views illustrating an exemplary semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and the second features are formed in direct contact, and may also include embodiments in which additional features may be formed between the first and the second features, such that the first and the second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure provides a novel vertical structure having multiple barrier layers, which can be applied to vertical gate-all-around (VGAA) devices. The material of the barrier layers can be SiN, SiCN, or SiCON. The barrier layers isolate a source, a drain, a gate including high-K layer and a metal gate from oxidation by other processes. Therefore, the vertical structure having the barrier layers may decrease: nanowire oxidation caused by changing critical dimension of the nanowire; source/drain oxidation; high-K dielectrics oxidation caused by changing equivalent oxide thickness (EOT); and metal gate oxidation, due to annealing processes. Additionally, the barrier layers can be used as a hard mask during contact etching processes to form self-aligned contacts.

The vertical structure may be configured as follows: the substrate material may be Si, SiGe, Ge, or III/V Epi (InP, GaAs, AlAs, InAs, InAlAs, InGaAs, InSb, GaSb, InAlSb, InGaSb); the nanowire material may be Si, SiGe, Ge, or III/V Epi (InP, GaAs, AlAs, InAs, InAlAs, InGaAs, InSb, GaSb, InAlSb, InGaSb); the substrate material can be same or different with the nanowire material; the high-K dielectrics may be a single layer or multiple layers structure with $HfO_2$, $ZrO_2$, $HfZrO_2$, $Ga_2O_3$, $Gd_2O_3$, $TaSiO_2$, $Al2O3$, or $TiO_2$; the work function metal (WFM) for PMOS vertical structures may be TiN, W, WN, Mo, or MoN; the WFM for NMOS vertical structures may be TiAl, TiAlC, or TaAlC; the metal gate (MG) material may be Al, W, Co, or Cu; the barrier layer material may be SiN, SiON, SiC, SiCN, SiCO, or SiCON; SAC metal material may be Al, W, Co, or Cu; Back-end-of-line (BEOL) metal material may be Al, W, Co, or Cu.

Additionally, the drain may refer to a region that has been treated as a drain, or a region that has not been treated but to be treated as a drain. The source may refer to a region that has been treated as a source, or a region that has not been treated but to be treated as a source. The channel may refer to a region that has been treated as a channel, or a region that has not been treated but to be treated as a channel.

FIG. 1 is a sectional view illustrating an exemplary semiconductor device in accordance with some embodiments. As shown in FIG. 1, a semiconductor device 100 is provided. In the semiconductor device 100, a first vertical structure 110, and a second vertical structure 120 are provided over a substrate 101. The first vertical structure 110 and the second vertical structure 120 may be vertical-gate-all-around devices electrically isolated by shallow trench isolation 102. The first vertical structure 110 may be a PMOS, and may include an n-well 111, a first source 112, a first channel 113, and a first drain 114. The second vertical structure 120 may be an NMOS, and may include a p-well 121, a second source 122, a second channel 123, and a second drain 124. Silicides 116, 126 are used to reduce contact resistance.

The first source 112 is disposed over the n-well 111. The first channel 113 is disposed over the first source 112. The first drain 114 is disposed over the first channel 113. The second source 122 is disposed over the p-well 121. The second channel 123 is disposed over the second source 122. The second drain 124 is disposed over the second channel 123. The following procedures may be performed on the first vertical structure 110 and the second vertical structure 120, so will only be discussed below with respect to the first vertical structure 110.

In one embodiment, the substrate 101 includes a crystalline silicon substrate. In some alternative embodiments, the substrate 101 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 101 may include an epitaxial layer (epi-layer), may be strained for performance enhancement, and/or may include a silicon-on-insulator (SOI) structure.

Figure 2:
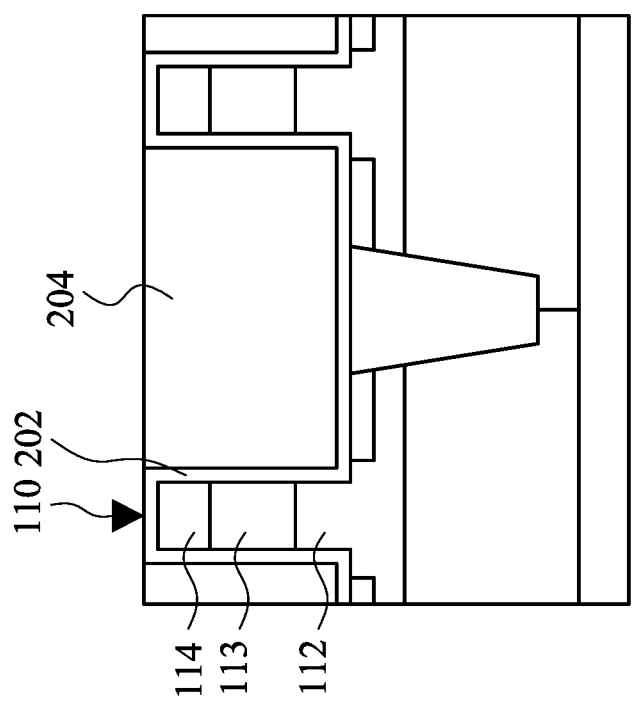

FIG. 2 is a sectional view illustrating the exemplary semiconductor device in accordance with some embodiments. As shown in FIG. 2, a first barrier layer 202 is formed over the source 112, the channel 113, and the drain 114 of the first vertical structure 110 to protect them from oxidation. The first barrier layer 202 may be formed of SiN, SiON, SiC, SiCN, SiCO, or SiCON. The first barrier layer 202 may have a thickness of, for example, about 30 to about 60 angstroms. In the embodiment, the first barrier layer 202 is formed in contact with the source 112, the channel 113, and the drain 114; in some embodiment, there are other layers therebetween so that the first barrier layer 202 is formed not in contact with but adjacent to them.

A first interlayer dielectric 204 (e.g., an oxide layer) is formed over the first barrier layer 202. To enhance quality of the first interlayer dielectric 204, oxidation processes may be applied to the first interlayer dielectric 204. In some embodiments, the enhancement is included in the formation of the first interlayer dielectric 204. The source 112, the channel 113, and the drain 114 of the first vertical structure 110 are covered by the first barrier layer 202, so that the oxidation processes for the enhancement does not damage or oxidize the first vertical structure 110. A chemical mechanical polishing is performed on the first interlayer dielectric 204 and stops on the first barrier layer 202. The protection that the first barrier layer 202 provides is not limited to the above oxidation and can be any that is likely to oxidize the first vertical structure 110.

Figure 3:
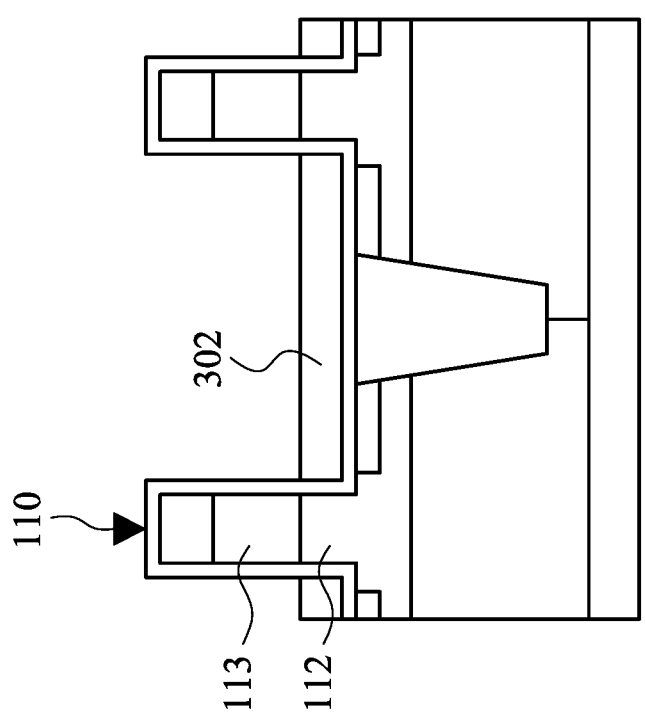

FIG. 3 is a sectional view illustrating the exemplary semiconductor device in accordance with some embodiments. As shown in FIG. 3, the first interlayer dielectric 204 is etched back to form a bottom isolation layer 302 corresponding to the source 112 of the first vertical structure 110 by using wet etching or plasma etching. In the embodiment, the bottom isolation layer 302 is aligned with a top surface of the source 112 in conjunction with the channel 113.

Figure 4:
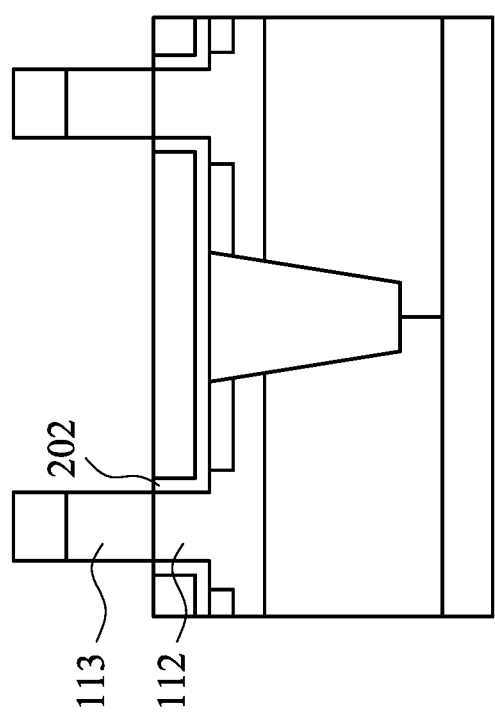

FIG. 4 is a sectional view illustrating the exemplary semiconductor device in accordance with some embodiments. As shown in FIG. 4, the first barrier layer 202 is etched back, by using wet etching or plasma etching, and corresponds to the source 112. In details, the first barrier layer 202 is aligned with the top surface of the source 112 in conjunction with the channel 113.

Figure 4A:
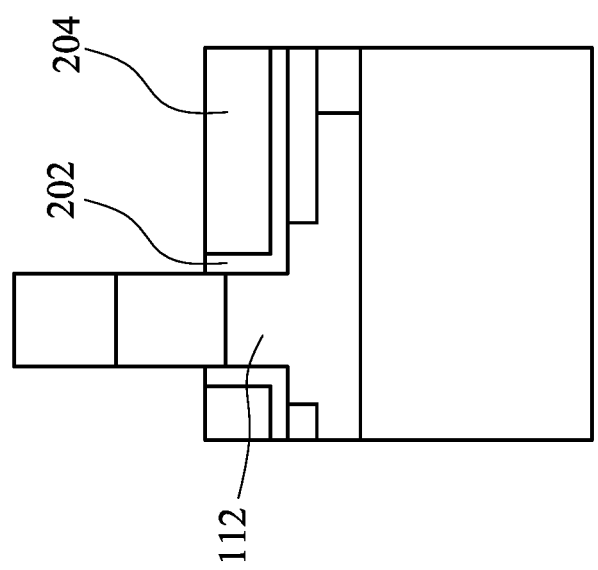

FIG. 4a is a sectional view illustrating a detailed diagram of the left portion of the exemplary semiconductor device in accordance with some embodiments. As shown in FIG. 4a, the first interlayer dielectric 204 and the first layer 202 are well-controlled to etched back by using wet etching or plasma etching. In the embodiment, the first interlayer dielectric 204 is higher than a top surface of the source 112 about 0 to about 10 nanometers. The method will provide a device operating in an accumulation mode.

Figure 4B:
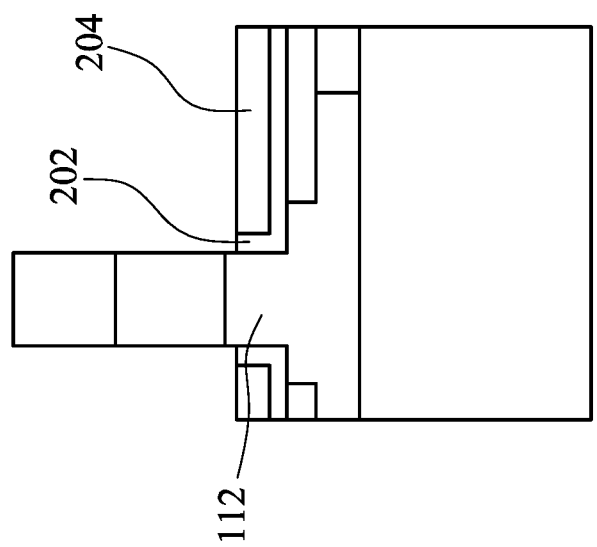

FIG. 4b is a sectional view illustrating another detailed diagram of the left portion of the exemplary semiconductor device in accordance with some embodiments. As shown in FIG. 4b, the first interlayer dielectric 204 and the first layer 202 are well-controlled to etched back by using wet etching or plasma etching. In the embodiment, the first interlayer dielectric 204 is lower than a top surface of the source 112 about 0 to about 10 nanometers. The method will provide a device operating in an inversion mode.

Figure 5:
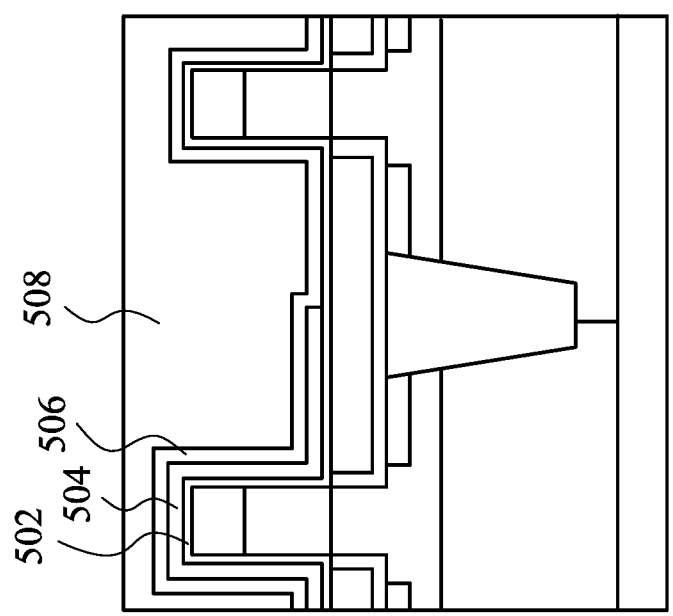

FIG. 5 is a sectional view illustrating the exemplary semiconductor device in accordance with some embodiments. Continuing from FIG. 4, as shown in FIG. 5, a high-k dielectric layer 502, work function metal (WFM) layers 504, 506, and a metal gate 508 are formed over the first vertical structure 110. The high-K dielectric material may be a single layer or multiple layers structure with $HfO_2$, $ZrO_2$, $HfZrO_2$, $Ga_2O_3$, $Gd_2O_3$, $TaSiO_2$, $Al2O3$, or $TiO_2$. The work function metal (WFM) may be TiN, W, WN, Mo, MoN, TiAl, TiAlC, or TaAlC. The metal gate material may be Al, W, Co, or Cu.

Figure 6:
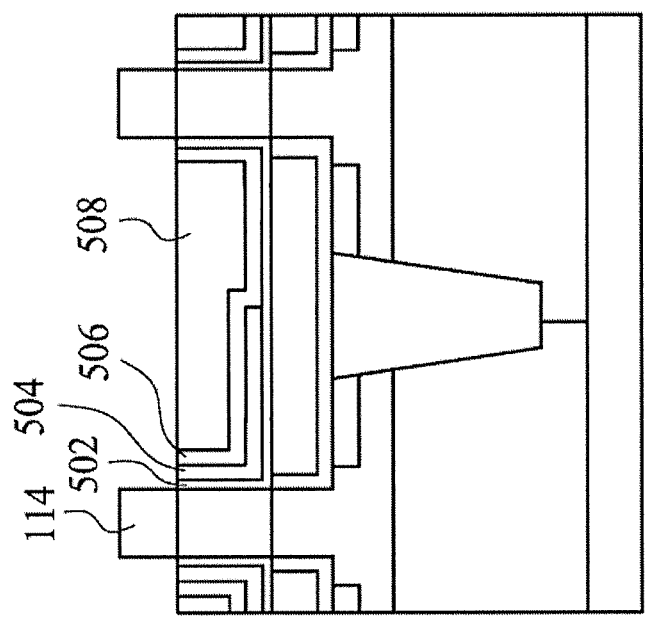

FIG. 6 is a sectional view illustrating the exemplary semiconductor device in accordance with some embodiments. As shown in FIG. 6, the high-k dielectric layer 502, the work function metal (WFM) layers 504, 506, and the metal gate 508 are etched back to expose the drain 114.

Figure 7:
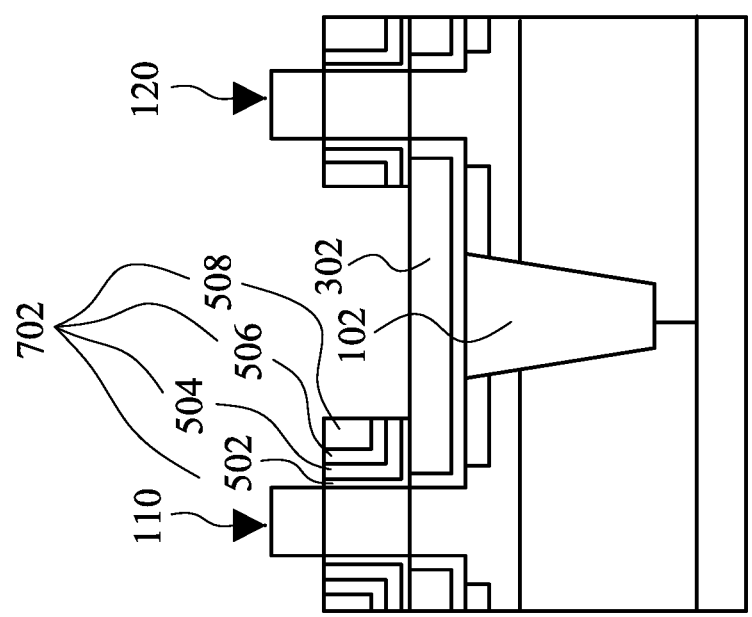

FIG. 7 is a sectional view illustrating the exemplary semiconductor device in accordance with some embodiments. As shown in FIG. 7, a portion of the high-k dielectric layer 502, the work function metal (WFM) layers 504, 506, and the metal gate 508 above the STI 102 between the first vertical structure 110 and the second vertical structure 120 are etched back, and the etch-back stops on the bottom isolation layer 302. A gate 702 is formed and includes the high-k dielectric layer 502, the work function metal (WFM) layers 504, 506, and the metal gate 508.

Figure 8:
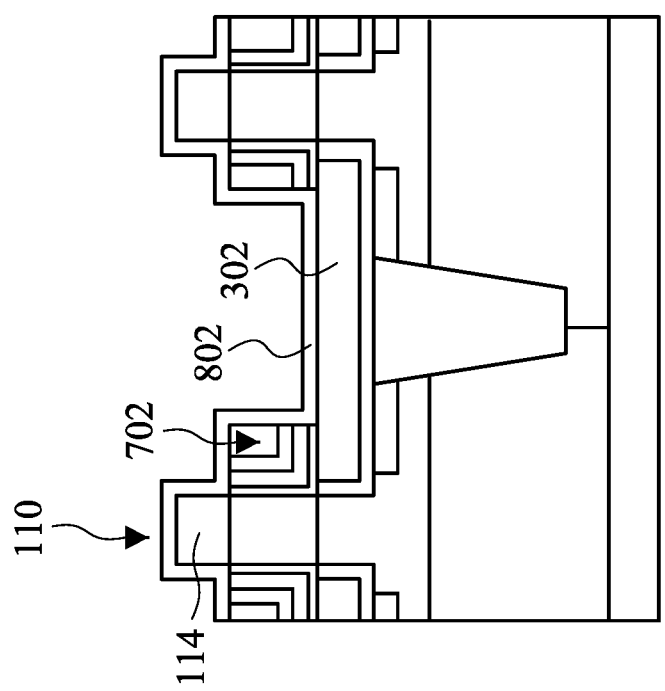

FIG. 8 is a sectional view illustrating the exemplary semiconductor device in accordance with some embodiments. As shown in FIG. 8, a second barrier layer 802 is formed over the gate 702 and the drain 114 of the first vertical structure 110, and the bottom isolation layer 302 so as to protect the gate 702 and the drain 114 from oxidation. In details, the second barrier layer 802 is formed in contact with a top and a sidewall of the gate 702, and a top and a sidewall the drain 114 as well.

The second barrier layer 802 may be formed of SiN, SiON, SiC, SiCN, SiCO, or SiCON. The second barrier layer 802 may have a thickness of, for example, about 30 to about 60 angstroms. In the embodiment, the second barrier layer 802 is formed in contact with the gate 702 and the drain 114; in some embodiment, there are other layers therebetween so that the second barrier layer 802 is formed not in contact with but adjacent to them.

Figure 9:
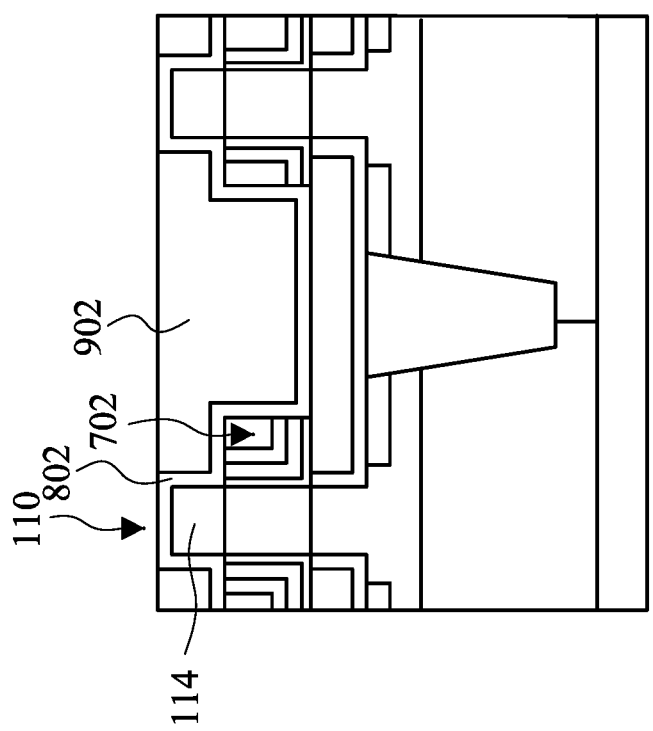

FIG. 9 is a sectional view illustrating the exemplary semiconductor device in accordance with some embodiments. As shown in FIG. 9, a second interlayer dielectric 902 (e.g., an oxide layer) is formed over the second barrier layer 802. In some embodiments, the enhancement is included in the formation of the second interlayer dielectric 902. To enhance quality of the second interlayer dielectric 902, oxidation processes may be applied to the second interlayer dielectric 902. The gate 702 and the drain 114 of the first vertical structure 110 are covered by the second barrier layer 802 so that the oxidation processes for the enhancement does not damage or oxidize the first vertical structure 110. Furthermore, a chemical mechanical polishing is performed on the second interlayer dielectric 902 and stops on the second barrier layer 802. The protection that the second barrier layer 802 provides is not limited to the above oxidation and can be any that is likely to oxidize the first vertical structure 110.

Figure 10:
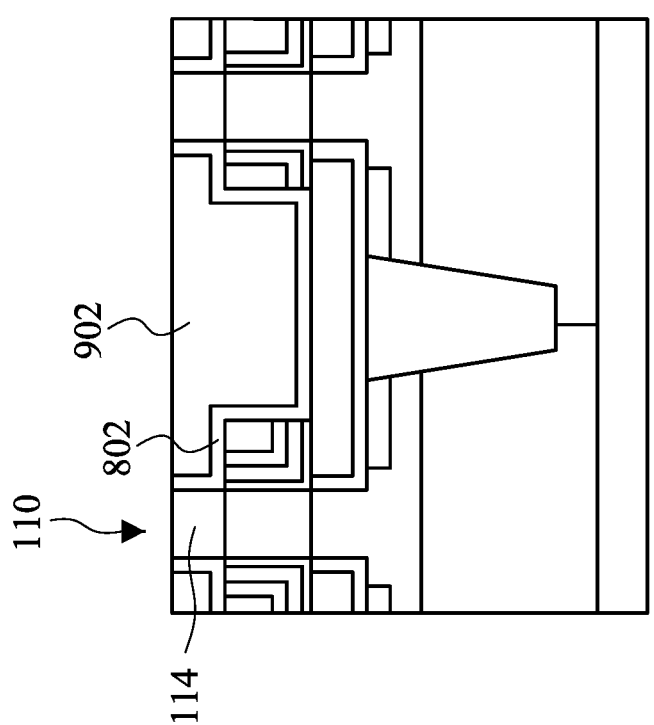

FIG. 10 is a sectional view illustrating the exemplary semiconductor device in accordance with some embodiments. As shown in FIG. 10, the second interlayer dielectric 902 and the second barrier layer 802 are etched back to expose a top of the drain 114 of the first vertical structure 110 by using wet etching or plasma etching.

Figure 11:
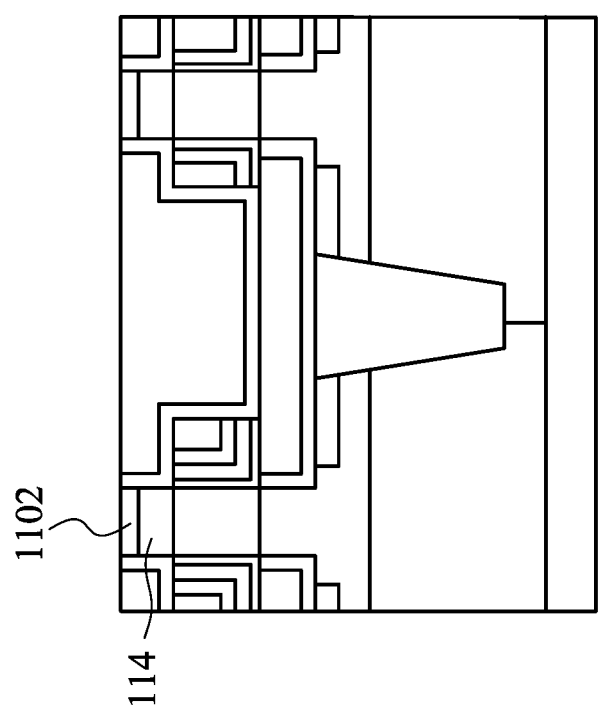

FIG. 11 is a sectional view illustrating the exemplary semiconductor device in accordance with some embodiments. As shown in FIG. 11, a metal is deposited on the drain 114, and annealing is performed on the metal to form a silicide 1102.

Figure 11A:
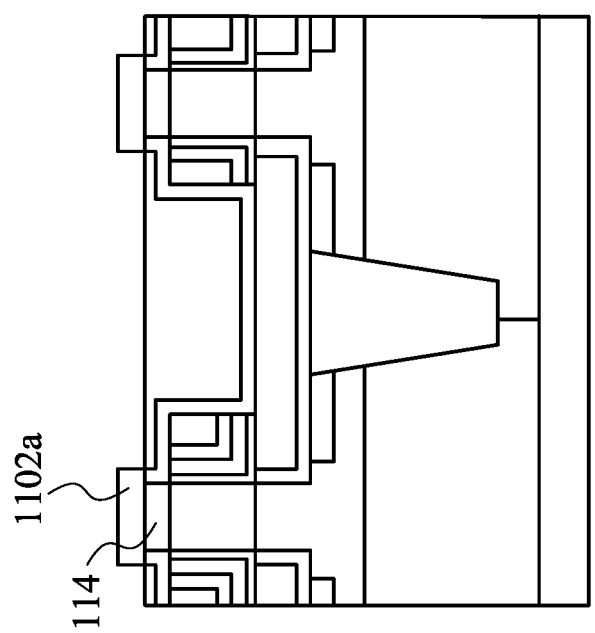

FIG. 11a is a sectional view illustrating the exemplary semiconductor device in accordance with some embodiments. Continuing from FIG. 9, as shown in FIG. 11a the second interlayer dielectric 902 and the second barrier layer 802 are etched back to expose not only a top of the drain 114 but also a portion of a sidewall of the drain 114 by using wet etching or plasma etching. Moreover, a metal is deposited the top and the sidewall of the drain 114, and annealing is performed on the metal to form a silicide 1102a having a greater width than the silicide 1102 in FIG. 11.

Figure 12:
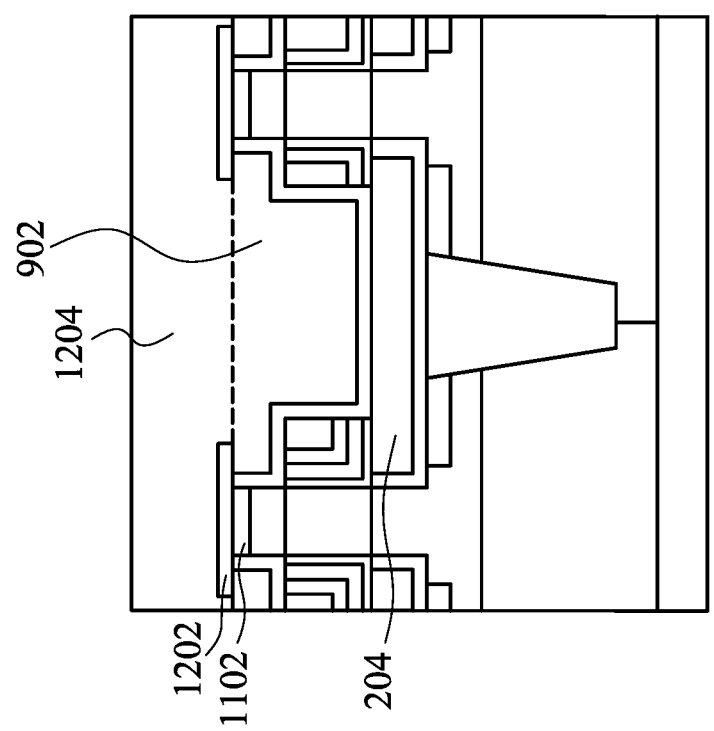

FIG. 12 is a sectional view illustrating the exemplary semiconductor device in accordance with some embodiments. Continuing from FIG. 11, as shown in FIG. 12, a pad 1202 is formed on the silicide 1102. A third interlayer dielectric 1204 (e.g., an oxide layer) is formed over the second interlayer dielectric 902 and the pad 1202.

Figure 13:
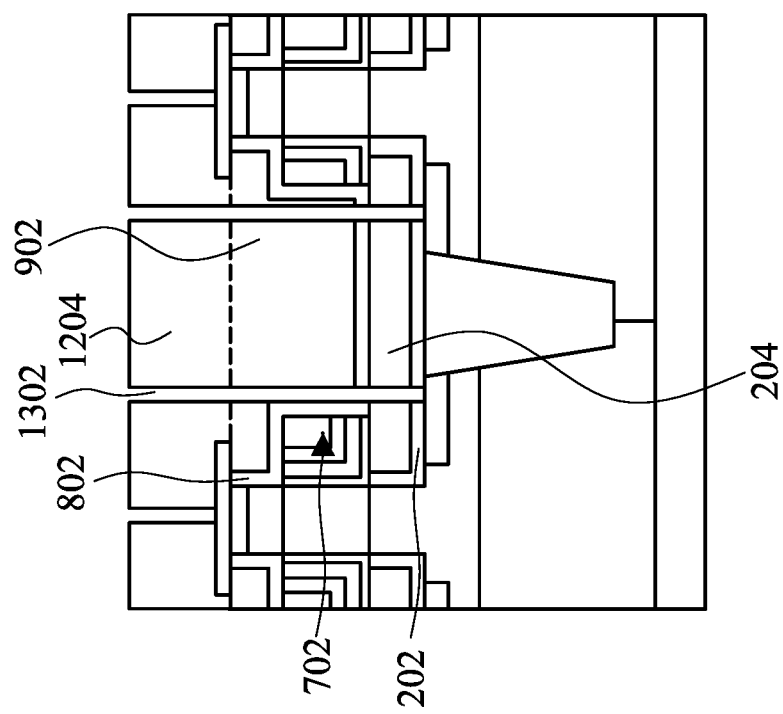

FIG. 13 is a sectional view illustrating the exemplary semiconductor device in accordance with some embodiments. As shown in FIG. 13, an opening 1302 is formed through the first barrier layer 202, the first interlayer dielectric 204, the second barrier layer 802, the second interlayer dielectric 902, and the third interlayer dielectric 1204. The formation of the opening 1302 may include: to etch the third interlayer dielectric 1204 and the second interlayer dielectric 902; to etch the second barrier layer 802; to etch the first interlayer dielectric 204; to etch the first barrier layer 202. The second barrier layers 802 can be used a hard mask during such formation of the opening 1302 to protect the gate 702 from unexpected damage.

Figure 14:
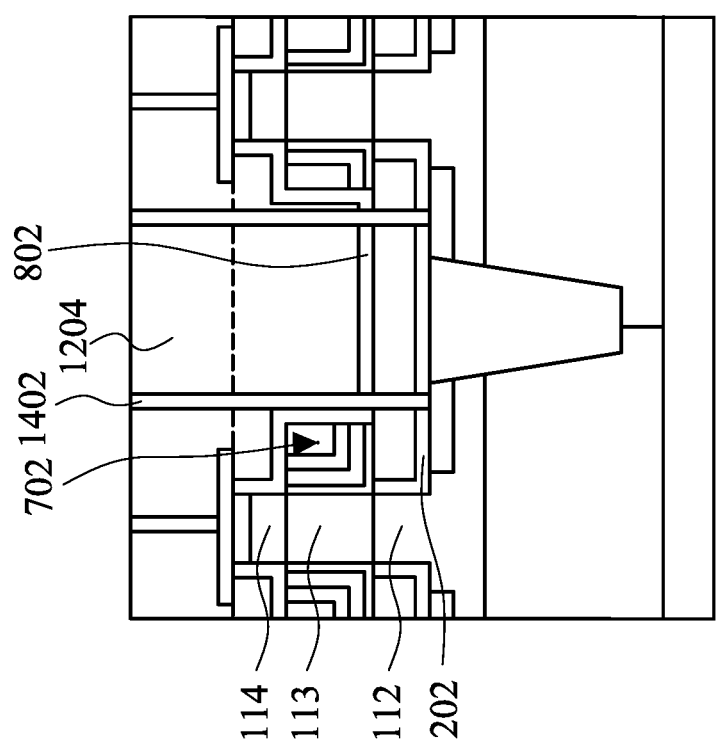

FIG. 14 is a sectional view illustrating the exemplary semiconductor device in accordance with some embodiments. As shown in FIG. 14, a contact metal 1402 is formed in the opening 1302. A chemical mechanical polishing is performed on the contact metal 1402 and stops on the third interlayer dielectric 1204.

In the abovementioned processes, the first barrier layer 202 protects the source 112, the channel 113, and the drain 114 of the first vertical structure 110 from the formation of the bottom isolation layer 302 which may damage or oxidize the first vertical structure 110. The second barrier layer 802 protects the gate 702 and the drain 114 from the formation of the second interlayer dielectric 902 which may damage or oxidize the first vertical structure 110.

The abovementioned disclosure shows one embodiment, and the following description disclosure will introduce another embodiment with other types of barrier layers.

Figure 15:
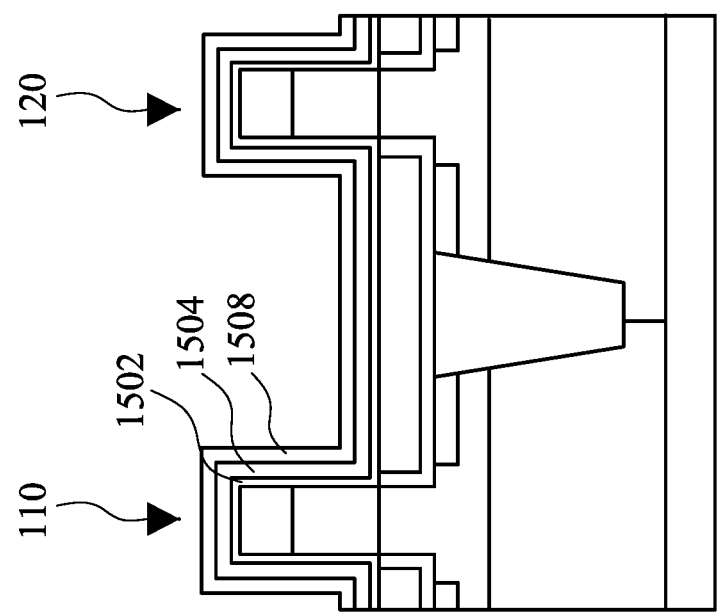
FIGS. 15-24 are sectional views illustrating another exemplary semiconductor device in accordance with some embodiments.

FIG. 15 is a sectional view illustrating the exemplary semiconductor device in accordance with some embodiments. Continuing from FIG. 4, as shown in FIG. 15, a high-k dielectric layer 1502, a work function metal (WFM) layers 1504, and a metal gate 1508 are formed over the first vertical structure 110. Compared to FIG. 5, the formation does not fill the recess between the first vertical structure 110 and the second vertical structure 120 with the metal gate 1508 but as a thin layer in FIG. 15.

Figure 16:
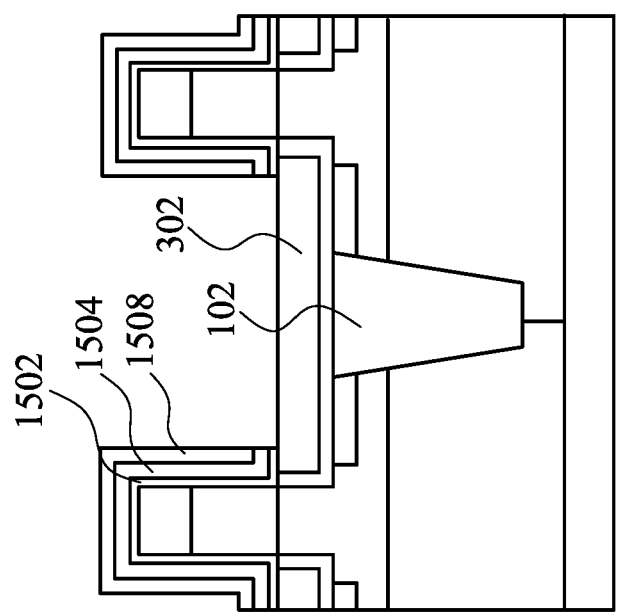

FIG. 16 is a sectional view illustrating the exemplary semiconductor device in accordance with some embodiments. As shown in FIG. 16, a portion of the high-k dielectric layer 1502, the work function metal (WFM) layer 1504, and the metal gate 1508 above the STI 102 between the first vertical structure 110 and the second vertical structure 120 are etched back, and the etch-back stops on the bottom isolation layer 302.

Figure 17:
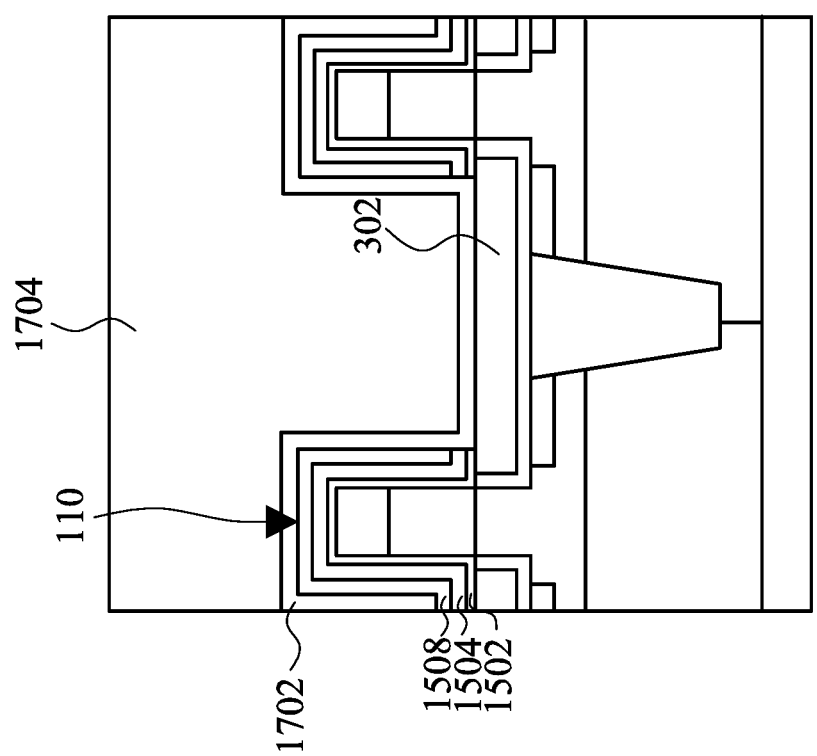

FIG. 17 is a sectional view illustrating the exemplary semiconductor device in accordance with some embodiments. As shown in FIG. 17, a second barrier layer 1702 is formed over the high-k dielectric layer 1502, the work function metal layer 1504, and the metal gate 1508 so as to protect them from oxidation. The second barrier layer 1702 may be formed of SiN, SiON, SiC, SiCN, SiCO, or SiCON. The second barrier layer 1702 may have a thickness of, for example, about 30 to about 60 angstroms. In the embodiment, the second barrier layer 1702 is formed in contact with the high-k dielectric layer 1502, the work function metal layer 1504, the metal gate 1508 and the bottom isolation layer 302; in some embodiment, there are other layers therebetween so that the second barrier layer 1702 is formed not in contact with but adjacent to them.

A second interlayer dielectric 1704 (e.g., an oxide layer) is formed over the second barrier layer 1702. To enhance quality of the second interlayer dielectric 1704, oxidation processes may be applied to the second interlayer dielectric 1704. In some embodiments, the enhancement is included in the formation of the second interlayer dielectric 1704. The high-k dielectric layer 1502, the work function metal layer 1504, and the metal gate 1508 are covered by the second barrier layer 1702 so that the oxidation processes for the enhancement does not damage or oxidize the first vertical structure 110. The protection that the second barrier layer 1702 provides is not limited to the above oxidation and can be any that is likely to oxidize the first vertical structure 110.

Figure 18:
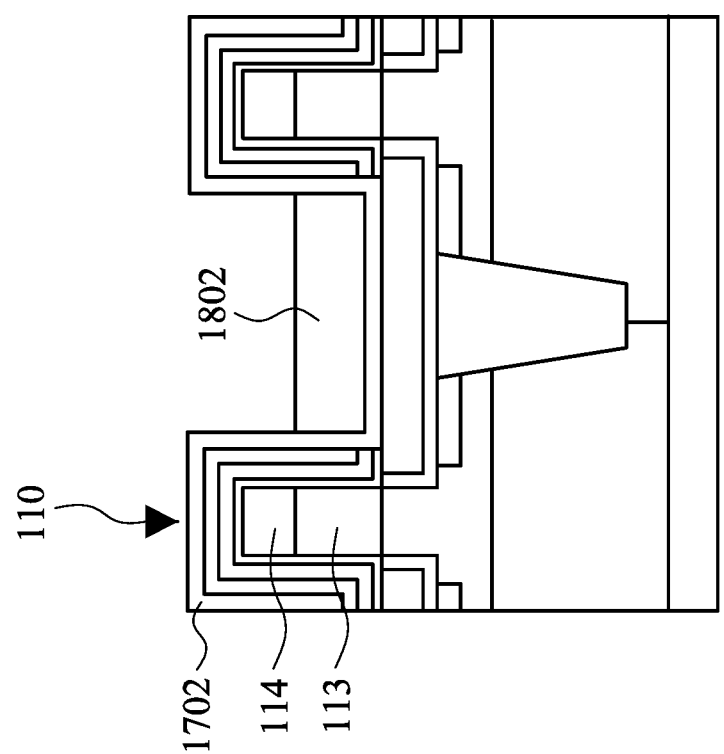

FIG. 18 is a sectional view illustrating the exemplary semiconductor device in accordance with some embodiments. As shown in FIG. 18, a chemical mechanical polishing is performed on the second interlayer dielectric 1704 and stops on the second barrier layer 1702. Moreover, the second interlayer dielectric 1704 is etched back as a middle isolation layer 1802 to be aligned with a top of the channel 113 in conjunction with the drain 114.

Figure 19:
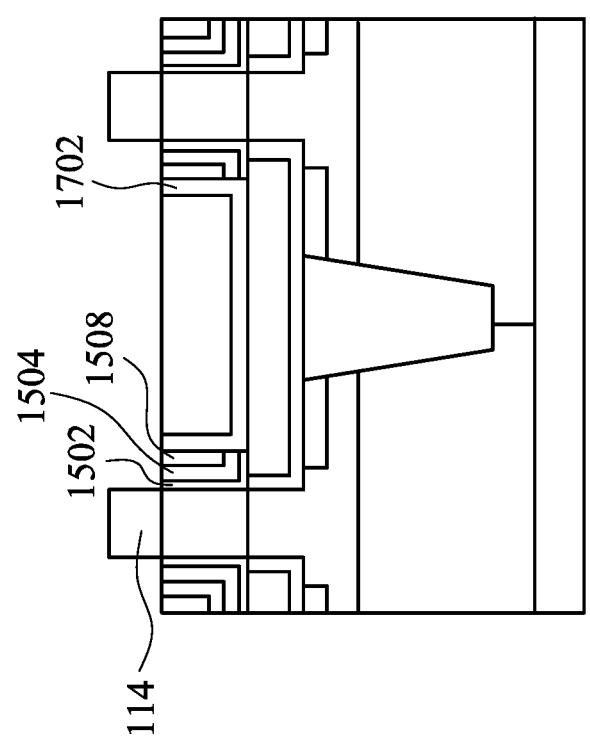

FIG. 19 is a sectional view illustrating the exemplary semiconductor device in accordance with some embodiments. As shown in FIG. 19, the second barrier layer 1702, the high-k dielectric layer 1502, the work function metal layer 1504, and the metal gate 1508 are etched back to disconnect from the drain 114.

Figure 20:
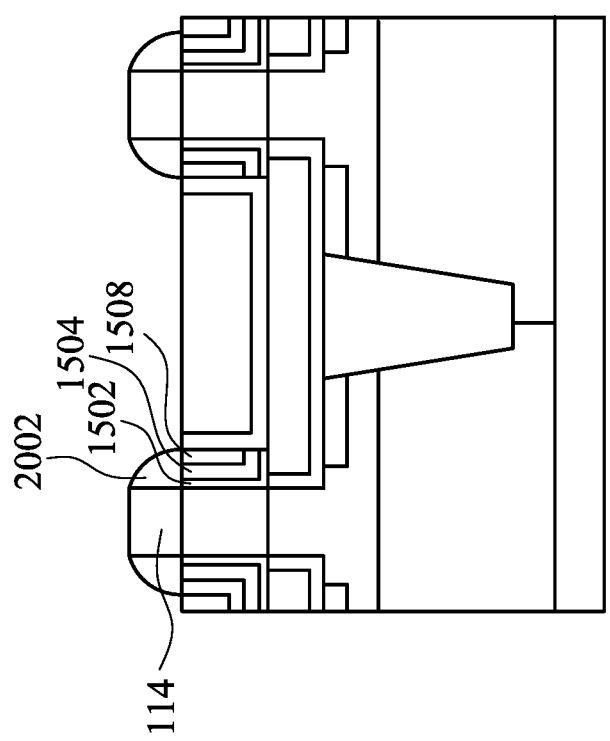

FIG. 20 is a sectional view illustrating the exemplary semiconductor device in accordance with some embodiments. As shown in FIG. 20, a third barrier layer 2002 is formed over the high-k dielectric layer 1502, the work function metal layer 1504, the metal gate 1508, and a sidewall of the drain 114 so as to protect them from oxidation. The third barrier layer 2002 may be formed of SiN, SiON, SiC, SiCN, SiCO, or SiCON. The formation of the third barrier layer 2002 may include: to conformally form the third barrier layer 2002; and to perform dry etching on the third barrier layer 2002 to expose the drain 114. In the embodiment, the third barrier layer 2002 is formed in contact with the high-k dielectric layer 1502, the work function metal layer 1504, the metal gate 1508, and a sidewall of the drain 114; in some embodiment, there are other layers therebetween so that the third barrier layer 2002 is formed not in contact with but adjacent to them.

Figure 21:
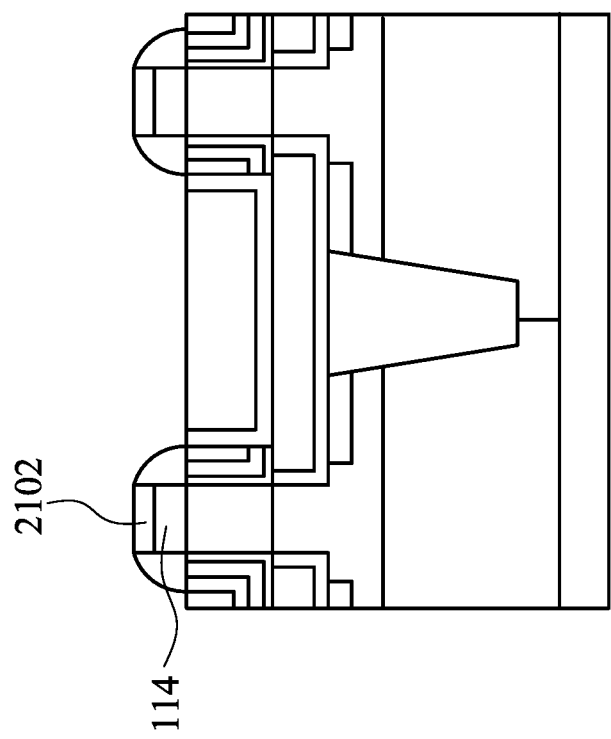

FIG. 21 is a sectional view illustrating the exemplary semiconductor device in accordance with some embodiments. As shown in FIG. 21, a metal is deposited on the drain 114, and annealing is performed on the metal to form a silicide 2102.

Figure 22:
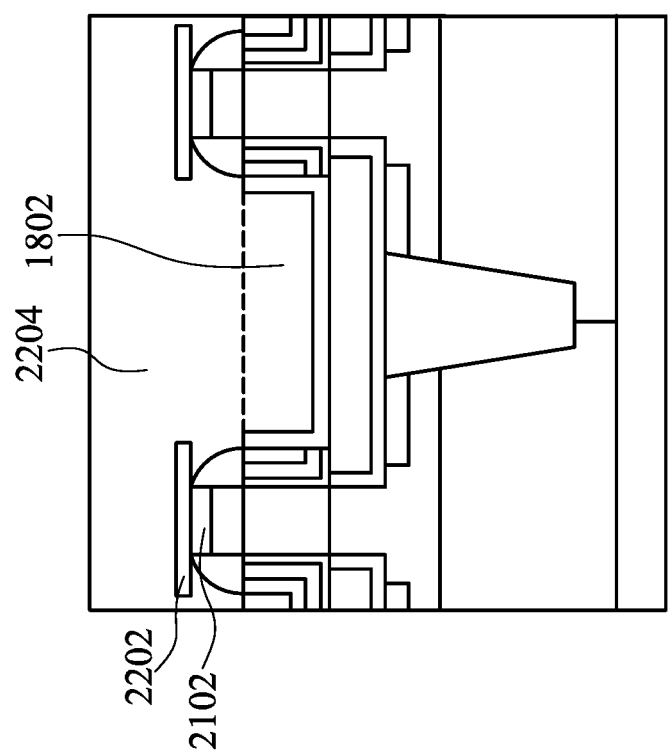

FIG. 22 is a sectional view illustrating the exemplary semiconductor device in accordance with some embodiments. As shown in FIG. 22, a pad 2202 is formed on the silicide 2102. A third interlayer dielectric 2204 (e.g., an oxide layer) is formed over the middle isolation layer 1802 and the pad 2202 as a top isolation layer.

Figure 23:
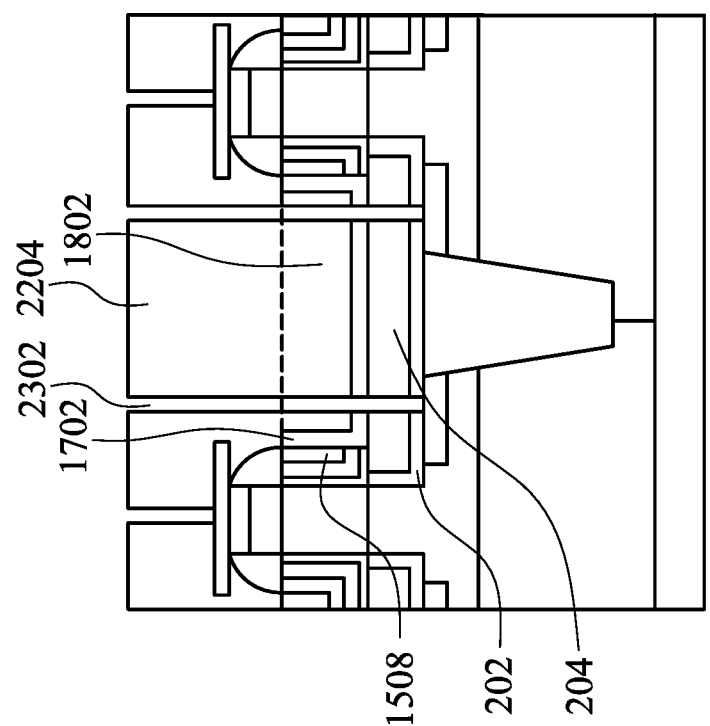

FIG. 23 is a sectional view illustrating the exemplary semiconductor device in accordance with some embodiments. As shown in FIG. 23, an opening 2302 is formed through the first barrier layer 202, the first interlayer dielectric 204, the second barrier layer 1702, the second interlayer dielectric 1802, and the third interlayer dielectric 2204. The formation of the opening 1302 may include: to etch the third interlayer dielectric 2204 and the second interlayer dielectric 1802; to etch the second barrier layer 1702; to etch the first interlayer dielectric 204; to etch the first barrier layer 202. In some embodiments, when the metal gate 1508 is closer to the opening 2302, the second barrier layers 1702 can be used a hard mask during such formation of the opening 2302 to protect the metal gate 1508 from unexpected damage.

Figure 24:
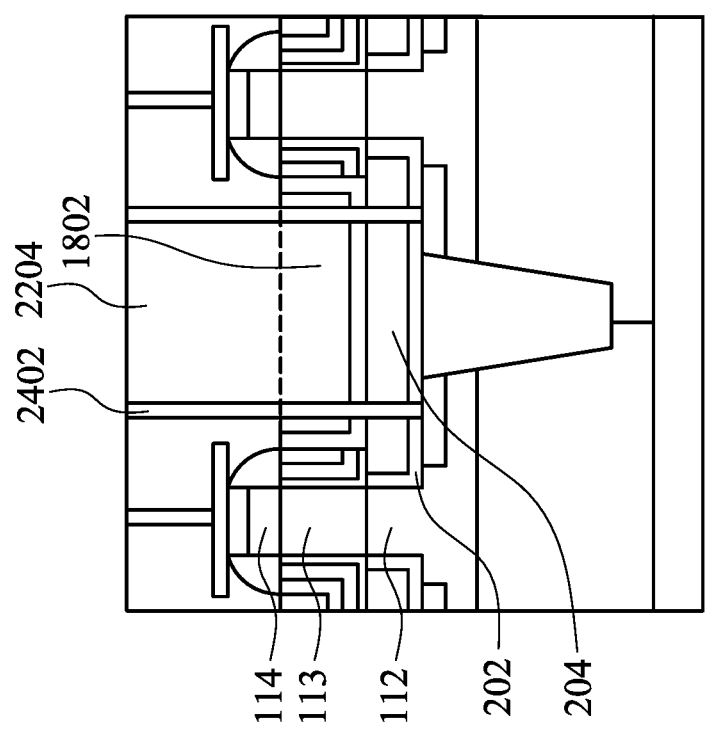

FIG. 24 is a sectional view illustrating the exemplary semiconductor device in accordance with some embodiments. As shown in FIG. 24, a contact metal 2402 is formed in the opening 2302. A chemical mechanical polishing is performed on the contact metal 2402 and stops on the third interlayer dielectric 2204.

In the abovementioned processes, the first barrier layer 202 protects the source 112, the channel 113, and the drain 114 of the first vertical structure 110 from the formation of the bottom isolation layer 302 which may damage or oxidize the first vertical structure 110. The second barrier layer 1702 protects the high-k dielectric layer 1502, the work function metal layer 1504, and the metal gate 1508 from the formation of the middle isolation layer 1802 which may damage or oxidize the first vertical structure 110. The third barrier layer 2002 protects the high-k dielectric layer 1502, the work function metal layer 1504, the metal gate 1508, and the drain 114 from the formation of the top isolation layer 2204 which may damage or oxidize the first vertical structure 110. Each of the formation of the bottom isolation layer 302, the middle isolation layer 1802, and the top isolation layer 2204 respectively corresponds to the source 112, the gate in contact with the channel 113, and the drain 114.

Figure 25:
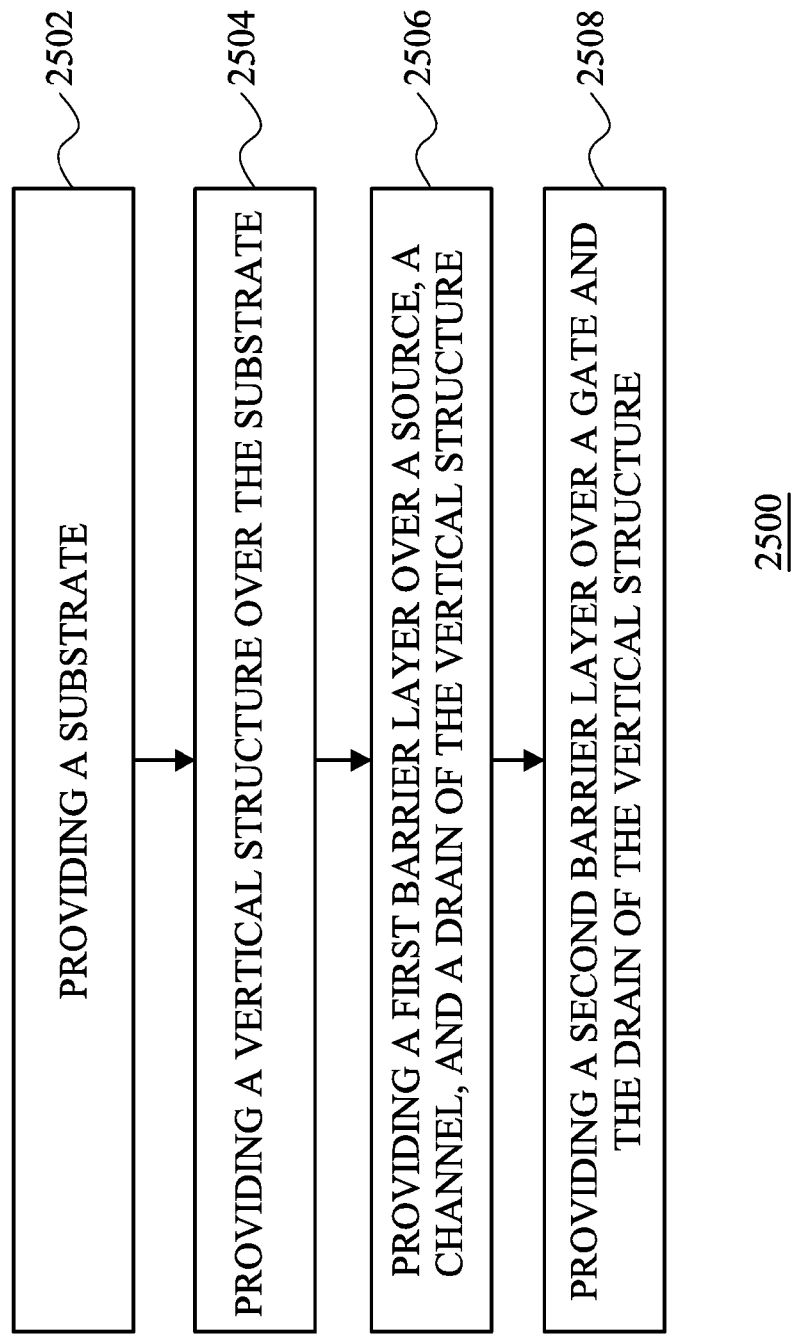
FIG. 25 is a flow chart for a method forming a vertical structure in accordance with some embodiments.

FIG. 25 is a flow chart for a method of forming a vertical structure with at least two barrier layers. As shown in FIG. 25, a method 2500 is provided. The method 2500 includes the following operations: providing a substrate (2502); providing a vertical structure over the substrate (2504); providing a first barrier layer over a source, a channel, and a drain of the vertical structure (2506); and providing a second barrier layer over a gate and the drain of the vertical structure (2508).

The method 2500 may further include forming a first interlayer dielectric over the first barrier layer corresponding to the source of the vertical structure. The method 2500 may further include forming the gate over the channel of the vertical structure. The method 2500 may further include forming a second interlayer dielectric over the second barrier layer corresponding to the gate and the drain of the vertical structure. The method 2500 may further include: performing chemical mechanical polishing on the second interlayer dielectric and stopping on the second barrier layer; etching the second interlayer dielectric and the second barrier layer to expose a top of the drain; and forming silicide on the drain.

The method 2500 may further include: forming an opening through the first barrier layer, the first interlayer dielectric, the second barrier layer, and the second interlayer dielectric; and forming contact metal in the opening. The method 2500 may further include etching the second barrier layer to expose the drain and a top of the gate; and forming a third barrier layer as a spacer over the top of the gate and a sidewall of the drain. The operation 2508 may further include providing the second barrier layer in contact with a sidewall of the drain of the vertical structure. The operation 2508 may further include providing the second barrier layer in contact with a sidewall of the drain and a top and a sidewall of the gate of the vertical structure.

Figure 26:
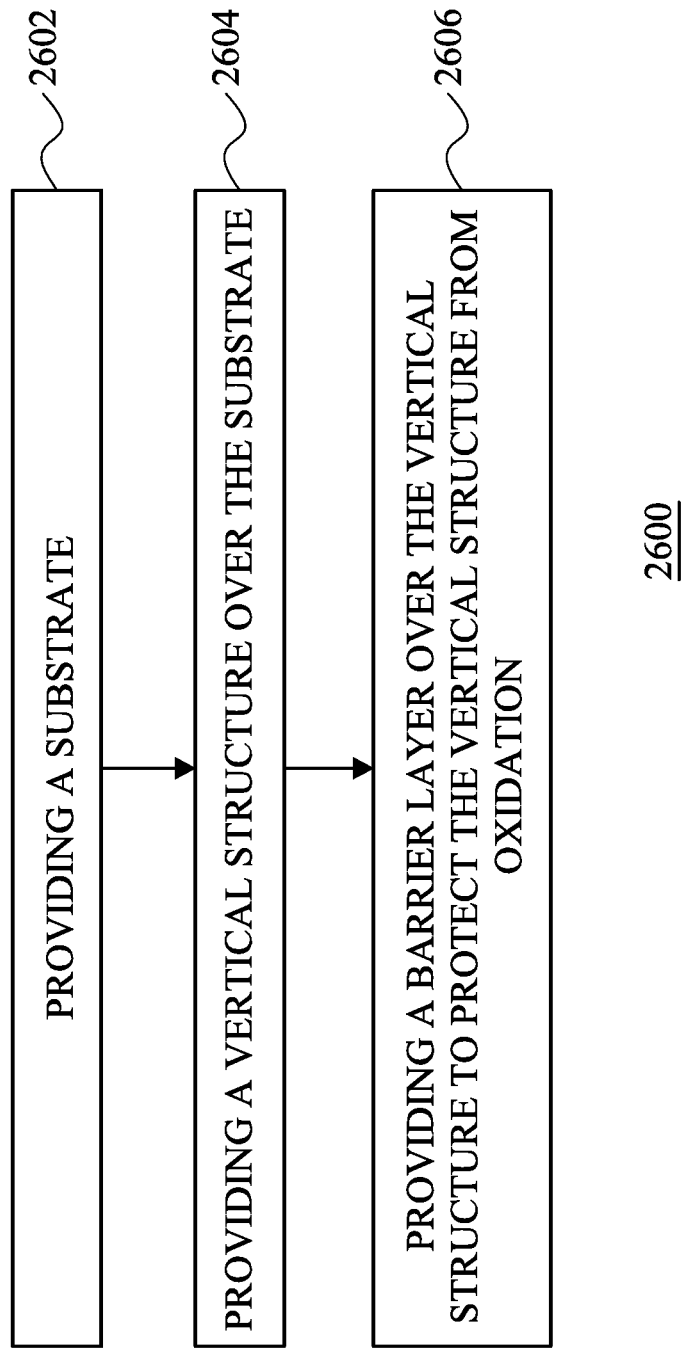
FIG. 26 is a flow chart for a method forming a vertical structure in accordance with some embodiments.

FIG. 26 is a flow chart for a method of forming a vertical structure. As shown in FIG. 26, a method 2600 is provided. The method 2600 includes the following operations: providing a substrate (2602); providing a vertical structure over the substrate (2604); and providing a barrier layer over the vertical structure to protect the vertical structure from oxidation (2606).

The operation 2606 may further include providing the barrier layer over the vertical structure to protect the vertical structure from oxidation during formation of an oxide layer. The operation 2606 may further include providing the barrier layer over a source of the vertical structure to protect the source during formation of the oxide layer corresponding to the source. The operation 2606 may further include providing the barrier layer over a gate of the vertical structure to protect the gate during formation of the oxide layer corresponding to the gate. The operation 2606 may further include providing the barrier layer over a drain of the vertical structure to protect the drain during formation of the oxide layer corresponding to the drain.

According to an exemplary embodiment, a semiconductor device comprises a source/drain region, a barrier layer that surrounds the source/drain region, and an interlayer dielectric that surrounds the barrier layer.

According to an exemplary embodiment, a semiconductor device comprises a source/drain region, a gate that is above the source/drain region, and a barrier layer that surrounds the gate.

According to an exemplary embodiment, a semiconductor device comprises a first source/drain region, a second source/drain region that is above the first source/drain region, a barrier layer that surrounds the second source/drain region, and an annealed metal material that is in contact with the second source/drain region and that is above the barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first source/drain region;

a first barrier layer surrounding the first source/drain region;
an interlayer dielectric surrounding the first barrier layer;
a channel region disposed over the first source/drain region;
a second source/drain region disposed above the channel region; and
a second barrier layer separated from the first barrier layer and surrounding the second source/drain region, wherein:
the first barrier layer has an L-shape in a cross section having a vertical portion disposed on a side face of the first source/drain region and a horizontal portion horizontally extending from a bottom of the vertical portion, and
the first barrier layer has a top surface lower than a top of the channel region.

2. The semiconductor device of claim 1, wherein the top surface of the first barrier layer is substantially aligned with a top surface of the first source/drain region.

3. The semiconductor device of claim 1, wherein the top surface of the first barrier layer is lower than a top surface of the first source/drain region.

4. The semiconductor device of claim 1, wherein the top surface of the first barrier layer is higher than a top surface of the first source/drain region.

5. The semiconductor device of claim 1, further comprising a first source/drain silicide region,
wherein the horizontal portion partially cover the first source/drain silicide region.

6. The semiconductor device of claim 1, wherein the interlayer dielectric is interposed between the first barrier layer and the second barrier layer in a vertical direction.

7. The semiconductor device of claim 1, further comprising an isolation region,
wherein the first barrier layer is disposed on the isolation region.

8. A semiconductor device comprising:
a first source/drain region;
a channel region disposed over the first source/drain region;
a gate structure surrounding the channel region; and
a first barrier layer surrounding the gate structure, wherein:
the gate structure includes a gate dielectric and a gate electrode,
the first barrier layer is in contact with the gate dielectric and the gate electrode, and
a bottom surface of the gate dielectric is above a first interlayer dielectric surrounding the first source/drain region.

9. The semiconductor device of claim 8, further comprising a second interlayer dielectric surrounding the first barrier layer and disposed over the first interlayer dielectric.

10. The semiconductor device of claim 9, wherein the second interlayer dielectric is oxidized.

11. The semiconductor device of claim 8, further comprising a second source/drain region disposed over the channel region,
wherein the first barrier layer continuously extends toward the second source/drain region and further surrounds the second source/drain region.

12. The semiconductor device of claim 8, wherein the first barrier layer has a uniform thickness.

13. The semiconductor device of claim 8, further comprising:
a second source/drain region disposed over the channel region; and
a second barrier layer provided separately from the gate dielectric, separated from the first barrier layer and surrounding the second source/drain region.

14. The semiconductor device of claim 8, wherein the first barrier layer includes at least one selected from the group consisting of SiN, SiON, SiC, SiCN, SiCO and SiCON.

15. A semiconductor device comprising:
a first source/drain region;
a channel region disposed over the first source/drain region;
a second source/drain region disposed over the channel region;
a first barrier layer surrounding the first source/drain region;
a second barrier layer surrounding the channel region; and
a third barrier layer surrounding the second source/drain region, wherein:
at least one selected from the group consisting of the first barrier layer, the second barrier layer and the third barrier layer has an L-shape in a cross section having a vertical portion and a horizontal portion horizontally extending from a bottom of the vertical portion,
the channel region is surrounded by a gate dielectric separately provided from the first, second and third barrier layers, and
a bottom surface of the gate dielectric is above the first barrier layer.

16. The semiconductor device of claim 15, further comprising an interlayer dielectric surrounding the first, second and third barrier layers.

17. The semiconductor device of claim 15, wherein second barrier layer is separated from the third barrier layer.

18. The semiconductor device of claim 15, wherein second barrier layer is continuously formed with the third barrier layer.

19. The semiconductor device of claim 15, wherein the first barrier layer and the second barrier layer have the L-shape in the cross section.

20. The semiconductor device of claim 15, wherein the first, second and third barrier layers have the L-shape in the cross section.

* * * * *